United States Patent
Ashbaugh et al.

(10) Patent No.: US 10,212,861 B2
(45) Date of Patent: Feb. 19, 2019

(54) VARIABLE FREQUENCY DRIVE CABINET VENTILATION SYSTEM, APPARATUS AND METHOD

(71) Applicant: Summit ESP, LLC, Tulsa, OK (US)

(72) Inventors: Ryan Bridwell Ashbaugh, Tulsa, OK (US); Tyler Clay Courtwright, Glenpool, OK (US); Casey Laine Newport, Tulsa, OK (US); David Reagan Manen, Tulsa, OK (US); Thomas John Gottschalk, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 15/442,433

(22) Filed: Feb. 24, 2017

(65) Prior Publication Data

US 2018/0249595 A1 Aug. 30, 2018

(51) Int. Cl.
*H05K 5/02* (2006.01)
*H05K 7/20* (2006.01)

(52) U.S. Cl.
CPC ....... *H05K 7/20909* (2013.01); *H05K 5/0213* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 5,436,622 A * | 7/1995 | Gutman | G08B 6/00 340/407.1 |
|---|---|---|---|
| 7,330,350 B2 * | 2/2008 | Hellriegel | G06F 1/20 165/122 |
| 8,436,559 B2 * | 5/2013 | Kidd | F04B 17/03 318/34 |
| 8,564,233 B2 | 10/2013 | Kidd et al. | |

(Continued)

*Primary Examiner* — Anthony M Haughton
*Assistant Examiner* — Razmeen Gafur
(74) *Attorney, Agent, or Firm* — Gilliam IP PLLC

(57) ABSTRACT

A variable frequency drive (VFD) cabinet ventilation system, apparatus and method is described. A VFD cabinet includes an internal air circulating closed circuit that extends through an inside of an air-to-air heat exchanger and an external air open circuit extending around an outside of the heat exchanger. The circulating internal air closed circuit extends through a chamber closed to ingress of external air, the chamber including electrical components of a VFD system. The external air open circuit makes a turn from downwards to upwards before flowing through a VFD chassis including a drive of the VFD system. A VFD cabinet ventilation method includes turning a flow of cabinet ventilation air from downwards to upwards to separate dirt from the ventilation air, passing the separated ventilation air through a VFD chassis, and circulating internal cabinet air through a closed circuit including an inside of a heat exchanger.

16 Claims, 10 Drawing Sheets

(56) References Cited

U.S. PATENT DOCUMENTS

| | | | | |
|---|---|---|---|---|
| 2002/0185358 | A1* | 12/2002 | Zeitler | B65G 47/52 198/370.02 |
| 2005/0066538 | A1* | 3/2005 | Goldberg | D06F 25/00 34/218 |
| 2005/0270738 | A1* | 12/2005 | Hellriegel | H05K 7/20836 361/679.46 |
| 2007/0007918 | A1* | 1/2007 | Watts | B05B 9/0861 318/400.41 |
| 2007/0211428 | A1* | 9/2007 | Doll | F04D 25/166 361/695 |
| 2009/0185346 | A1* | 7/2009 | Cairo | H05K 7/20127 361/692 |
| 2009/0215375 | A1* | 8/2009 | Hagensen | F23L 17/005 454/42 |
| 2010/0029195 | A1* | 2/2010 | Jalali | F24F 3/0442 454/341 |
| 2010/0110626 | A1* | 5/2010 | Schmitt | H05K 7/1497 361/679.47 |
| 2010/0139908 | A1* | 6/2010 | Slessman | F28F 9/0265 165/279 |
| 2010/0141193 | A1* | 6/2010 | Rotondo | F01D 15/08 318/432 |
| 2010/0154448 | A1* | 6/2010 | Hay | G06F 1/20 62/175 |
| 2012/0014061 | A1* | 1/2012 | Slessman | H05K 7/20745 361/691 |
| 2012/0023985 | A1* | 2/2012 | Dahl | B64F 1/362 62/126 |
| 2012/0125920 | A1* | 5/2012 | Novak | C10G 1/02 219/690 |
| 2012/0127657 | A1* | 5/2012 | Keisling | H05K 7/20827 361/679.53 |
| 2012/0327602 | A1* | 12/2012 | Kulkarni | H02M 7/003 361/700 |
| 2013/0094147 | A1* | 4/2013 | Shin | G06F 1/1601 361/707 |
| 2013/0163193 | A1* | 6/2013 | Ballantine | H05K 7/20763 361/679.47 |
| 2013/0201618 | A1* | 8/2013 | Czamara | H05K 7/1497 361/679.5 |
| 2014/0048244 | A1* | 2/2014 | Wallace | F28F 27/00 165/253 |
| 2014/0063730 | A1* | 3/2014 | Hay | G06F 1/20 361/679.46 |
| 2014/0268570 | A1* | 9/2014 | Crouch | H05K 7/20936 361/696 |
| 2014/0298846 | A1* | 10/2014 | Taras | F04B 39/06 62/291 |
| 2014/0324234 | A1* | 10/2014 | Hromadka | B65D 88/121 700/283 |
| 2014/0340842 | A1* | 11/2014 | Towner | F24F 6/02 361/679.48 |
| 2014/0343745 | A1* | 11/2014 | Slessman | B31C 9/00 700/297 |
| 2014/0368152 | A1* | 12/2014 | Pasche | F04B 49/02 318/805 |
| 2015/0003015 | A1* | 1/2015 | Kulkarni | H05K 7/1432 361/700 |
| 2015/0107289 | A1* | 4/2015 | Sun | F25B 1/053 62/324.6 |
| 2015/0327399 | A1* | 11/2015 | West | H05K 7/20945 361/701 |
| 2015/0342096 | A1* | 11/2015 | Czamara | H05K 7/1497 361/679.49 |
| 2015/0351290 | A1* | 12/2015 | Shedd | F25B 23/006 361/679.47 |
| 2015/0375125 | A1* | 12/2015 | Lurie | A63G 31/00 472/49 |
| 2015/0377537 | A1* | 12/2015 | West | F25B 13/00 62/115 |
| 2016/0017758 | A1* | 1/2016 | Vermeersch | F01K 25/103 60/646 |
| 2016/0050797 | A1* | 2/2016 | Smith | H05K 7/20836 361/679.48 |
| 2016/0099398 | A1* | 4/2016 | Lorimer | H01L 35/30 136/201 |
| 2016/0106009 | A1* | 4/2016 | Slessman | F28F 9/0265 361/679.47 |
| 2016/0169509 | A1* | 6/2016 | Fowler | C10B 47/44 202/117 |
| 2016/0169510 | A1* | 6/2016 | Pozarnsky | F23J 15/08 110/203 |
| 2016/0216717 | A1* | 7/2016 | Elliott | G05B 19/102 |
| 2016/0229079 | A1* | 8/2016 | Chute | A61L 2/04 |
| 2017/0099747 | A1* | 4/2017 | Roy | G06F 1/20 |
| 2017/0126077 | A1* | 5/2017 | Torrey | H02K 1/16 |
| 2017/0128859 | A1* | 5/2017 | Levitt | B01D 29/117 |

* cited by examiner

VARIABLE FREQUENCY DRIVE CABINET VENTILATION SYSTEM, APPARATUS AND METHOD

BACKGROUND OF THE INVENTION

1. Field of the Invention

Embodiments of the invention described herein pertain to the field of variable frequency drives for electric submersible pumps. More particularly, but not by way of limitation, one or more embodiments of the invention enable a variable frequency drive cabinet ventilation system, apparatus and method.

2. Description of the Related Art

Many different applications employ Variable Frequency Drives (VFDs), from small appliances to pump applications. Production wells require electric submersible pumps (ESP) to lift fluid from underground when pressure within the well is not enough to force fluid out of the well. Motors for ESP pumps may be controlled using VFD systems. Typically in a VFD system, the drive, a VFD controller and a user interface is housed at the well's surface in a cabinet to shield the VFD system from the elements. The arrangement of a VFD system inside a cabinet is known as a "packaged" VFD. The cabinet is usually metal and covered to protect the VFD from rain and snow. VFD cabinets are generally located at or near the well where the ESP is deployed. The well site may be located in an area that is remote and undeveloped.

Additionally, may applications require that fluids be pressurized and moved between surface locations and/or transported through a supply line to a tank. For example, it may be desirable to transport produced oil to a processing facility located remotely from the well. In such circumstances, submersible pumps may be used as surface pumps in horizontal pumping systems. Horizontal surface pump assemblies are also used for salt water disposal, water injection and other fluid transfer applications. Horizontal pumping assemblies typically include a multistage centrifugal pump horizontally mounted to a skid and driven by an electric motor. Electric motors used in horizontal pumping applications may also be controlled using packaged VFD systems in remote or underdeveloped areas.

VFDs, also called variable-speed drives, adjustable frequency drives, AC drives, active front-end drives or inverter drives are types of adjustable frequency drives used in electro-mechanical drive systems to control AC motor speed and torque by varying motor input frequency and voltage. The main drive may commonly be a solid-state-electronics power conversion system. An embedded microprocessor control system, such as a VFD controller, may govern the overall operation of the VFD. Packaged VFDs are most common in outdoor, remote applications and conventionally include an open chassis enclosed by a cabinet. The VFD's open chassis includes one or more electrical drives, which produce an output frequency to the motor.

A problem that arises with conventional packaged VFDs operating in remote and/or outdoor applications is that the VFD is susceptible to damage from overheating. Sun exposure, as well as heat generated from the drive itself, raises the temperature inside the cabinet. If the VFD becomes too hot, it will overheat leading to failure or shutdown of the drive. Summertime operation is especially problematic where high temperatures cause VFD shutdown and create delays that increase the cost of the production well.

Currently, attempts have been made to address overheating of VFDs by ventilating the VFD cabinet. FIG. 1 illustrates a conventional ventilated cabinet of the prior art. As shown in FIG. 1, conventional cabinet 100 includes conventional air intake 105 and conventional vent 110 that allow air from outside to enter conventional cabinet 100. As shown in FIG. 1, conventional cabinet 100 has an open, single chamber design, allowing conventional booster fan 115 near the bottom of the chamber to circulate air through the inside of conventional cabinet 100. The cooling air flows inside conventional VFD open chassis 120, cooling the drive. Conventional exhaust pipe 125 allows air to exit conventional cabinet 100, typically by making a sharp turn near the ceiling of the cabinet.

Nevertheless, conventional ventilated VFD cabinets have proved insufficient to properly cool the VFD system when the VFD is placed in remote, outdoor production fields. The conventional cabinet design provides little-to-no directional guidance to the airflow, and as the air entering the cabinet becomes warmer, the air bounces off the ceiling. The effect is a turbulent flow that causes a vacuum inside the cabinet, and a failure to effectively move cooling, fresh air around the hot electrical components. Thus, the cooling provided by conventional ventilation is inadequate, particularly when outdoor temperatures reach 100° F. or higher.

Another problem that arises in outdoor applications is that the cooling ventilation air carries sand, dirt and other particulates from the surrounding environment into the cabinet. The sand accumulates on contacts and electrical connections, damaging the electrical components of the VFD and supporting system. VFD cabinets filled with dirt do not operate properly and are prone to failure of the drive and/or supporting components. In addition, when sand coats VFD components, the sand acts as an insulator further contributing to overheating problems.

As is apparent from the above, current ventilation techniques for VFD cabinets are inadequate to cool VFD systems in production field applications. Therefore, there is a need for an improved VFD cabinet ventilation system, apparatus and method.

BRIEF SUMMARY OF THE INVENTION

One or more embodiments of the invention enable a variable frequency drive (VFD) cabinet ventilation system, apparatus and method.

An improved VFD cabinet ventilation system, apparatus and method is described. An illustrative embodiment of a VFD cabinet includes portions defining an outside air flow path, the outside air flow path extending: from outside the VFD cabinet into the VFD cabinet through an air intake, from the air intake downwards between a housing of the VFD cabinet and a first vertical plate, turning upwards through a channel between the first vertical plate and a second vertical plate, continuing upwards through a VFD chassis, and out of the VFD cabinet through a curved exit vent; and portions defining an internal air closed circuit, the internal air closed circuit extending: from a chamber within the VFD cabinet downward through a first plenum, from the first plenum through an inside of heat exchanger pipes, from the inside of the heat exchanger pipes upward through a second plenum, and from the second plenum returning into the chamber, the chamber closed from ingress of outside air. In some embodiments, the portions defining an outside air flow path include a shrouded plenum fluidly coupling an inside of the VFD chassis and the channel between the first vertical plate and the second vertical plate. In certain embodiments, the outside air flow path passes by VFD cooling fins as the outside air flow path continues upwards through the VFD chassis. In some embodiments, the curved exit vent has an inlet opening that receives outside air vertically from the VFD and an exit opening that expels outside air horizontally. In certain embodiments, the curved exit vent curves about 90°. In some embodiments, the outside air flow path extends around an outside of the heat exchanger pipes as it flows downwards between the housing of the VFD cabinet and the first vertical plate. In certain embodiments, the VFD cabinet includes an intake fan proximate the air intake between the housing of the VFD cabinet and the first vertical plate. In some embodiments, the intake fan creates positive pressure proximate the portion of the cabinet defining the turn upwards between the first vertical plate and the second vertical plate. In certain embodiments, the chamber includes a VFD controller and a VFD user interface, and the VFD chassis includes a drive. In some embodiments, the drive includes a series of heat exchange fins exposed to the outside air flow path. In certain embodiments, the drive is operably coupled to an electric submersible pump motor. In certain embodiments, the VFD cabinet includes a lower chamber below the closed chamber, the lower chamber open to outside air and including a potted inductor and a booster fan. In certain embodiments, the booster fan is a resistor bank booster fan. In some embodiments, the outside air flow path flows underneath the first vertical plate before turning upwards between the first vertical plate and the second vertical plate.

An illustrative embodiment of a variable frequency drive (VFD) cabinet includes an internal air closed circuit that extends through an inside of an air-to-air heat exchanger, an external air open circuit extending around an outside of the air-to-air heat exchanger, the internal air closed circuit circulating through a chamber closed to ingress of external air, the chamber including electrical components of a VFD system, and the external air open circuit making a turn from downwards to upwards before flowing through a VFD chassis including a drive of the VFD system. In some embodiments, the VFD chassis is fluidly coupled to a curved exit vent. In certain embodiments, the external air open circuit includes a positive pressure fan proximate the air-to-air heat exchanger. In certain embodiments, the internal air flows around an outside of the VFD chassis in the chamber. In some embodiments, the external air open circuit flows downwards through a first channel and upwards through a second channel, wherein the first channel and the second channel are separated by a first vertical plate. In certain embodiments, external air flows underneath the first vertical plate to travel from the first channel to the second channel. In some embodiments, the second channel is defined by the first vertical plate and a second vertical plate, the second vertical plate and a horizontal plate defining the chamber.

An illustrative embodiment of a VFD cabinet ventilation method includes flowing outside air downwards into a VFD cabinet, boosting a pressure of the downwards flowing outside air with a fan, passing the downwards flowing outside air passed an outside of a heat exchanger, turning a flow of the downwards flowing outside air from downwards to upwards, moving the upwards flowing outside air through a VFD chassis including a drive before sending the upwards flowing outside air out of the VFD cabinet, and circulating internal cabinet air through a closed circuit extending from a chamber through an inside of the heat exchanger, the chamber sealed from the outside air and including portions of a VFD system. In some embodiments, turning the flow of outside air from downwards to upwards causes dirt to separate from the outside air before the outside air moves through cooling fins within the VFD chassis. In certain embodiments, turning the flow of the downwards flowing outside air from downwards to upwards includes guiding the outside air around vertical plates that create air channels. In some embodiments, sending the upwards flowing outside air out of the VFD cabinet includes guiding the outside air from an upwards flow to a horizontal flow through a curved exit vent. In certain embodiments, the VFD cabinet ventilation method includes operating an electric submersible pump (ESP) motor with the drive. In some embodiments, the ESP motor is downhole in a production well. In certain embodiments, the VFD system operates the ESP motor, stores information from downhole sensors coupled to the ESP motor and interfaces with an operator of the ESP motor. In some embodiments, the VFD cabinet ventilation method further includes operating a horizontal surface pump motor with the drive.

In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings in which.

DETAILED DESCRIPTION

Figure 1:
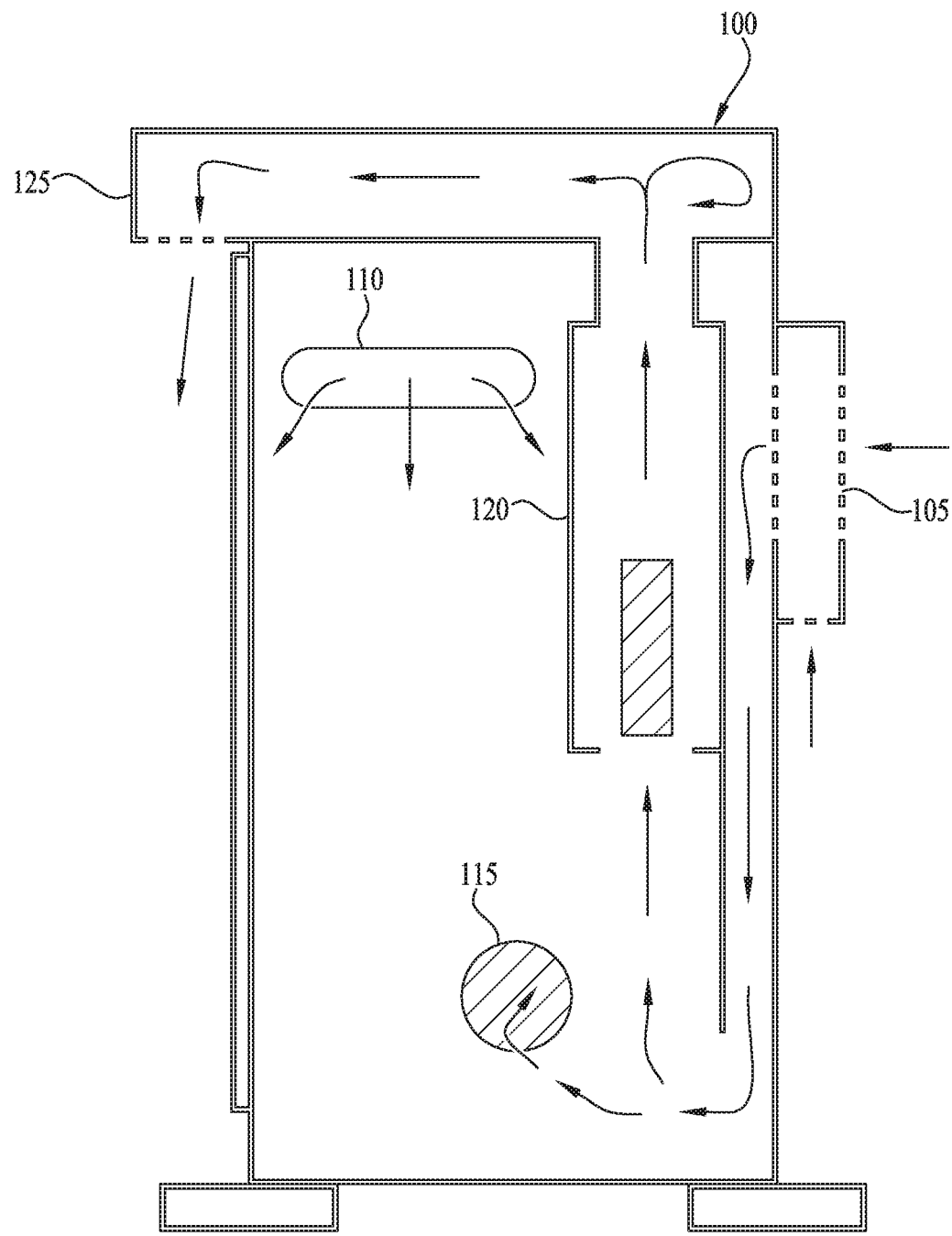
FIG. 1 is schematic of airflow through a conventional "packaged" variable frequency drive (VFD) cabinet of the prior art.

A variable frequency drive (VFD) cabinet ventilation system, apparatus and method is described. In the following exemplary description, numerous specific details are set forth in order to provide a more thorough understanding of embodiments of the invention. It will be apparent, however, to an artisan of ordinary skill that the present invention may be practiced without incorporating all aspects of the specific details described herein. In other instances, specific features, quantities, or measurements well known to those of ordinary skill in the art have not been described in detail so as not to obscure the invention. Readers should note that although examples of the invention are set forth herein, the claims, and the full scope of any equivalents, are what define the metes and bounds of the invention.

As used in this specification and the appended claims, the singular forms "a", "an" and "the" include plural referents unless the context clearly dictates otherwise. Thus, for example, reference to a chassis includes one or more chassis.

As used in this specification and the appended claims, "coupled" refers to either a direct connection or an indirect connection (e.g., at least one intervening connection) between one or more objects or components. The phrase "directly attached" means a direct connection between objects or components.

As used in this specification and the appended claims, "outside air" or "external air" means air that originates outside the VFD cabinet and flows from outside the VFD cabinet into the VFD cabinet during normal operation of the VFD system.

As used in this specification and the appended claims, "inside air" or "internal air" means air that originates within the VFD cabinet and remains within the VFD cabinet while the VFD system is operating, except for instances when the VFD cabinet may be opened for maintenance or repairs.

As used in this specification and the appended claims, "sand", "dirt", and "particulates" are used interchangeably to mean any solid contaminant carried by outside air.

Illustrative embodiments are described in terms of a VFD packaged system operating a downhole motor of an electric submersible pump (ESP) assembly. However illustrative embodiments are not so limited and may be applicable where a VFD system operates inside a cabinet and is subject to damage from overheating and/or contamination from dirt. For example, illustrative embodiments may be employed in horizontal pumping applications, drilling applications, hydraulic pumps, extruder drive controls and/or active front end regenerative solutions.

Illustrative embodiments provide a VFD cabinet ventilation system that may reduce the risk of overheating of electrical components of a VFD system while reducing contamination from sand, dirt, and dust. Illustrative embodiments may provide a VFD cabinet that remains on average 6° F. cooler during VFD operation than conventional VFD cabinets. Illustrative embodiments may improve the flow path of air circulating through a VFD cabinet by providing a ventilation flow that simultaneously improves cooling of a VFD system inside the cabinet, employs indirect cooling within a sealed chamber and removes particulates from the ventilation flow before the air passes by sensitive VFD electrical components that may be exposed to outside air.

Illustrative embodiments include a VFD cabinet partitioned into sections by plates. The plates may isolate a clean chamber containing drive electronics and other electronics, such as DIN rails, contactors, power supplies, relays, auxiliary contacts, transformers and programmable logic controllers (PLC). The isolated chamber may be sealed, isolated and/or closed from outside air and indirectly cooled by an air-to-air heat exchanger. To create the sealed chamber, a horizontal plate may partition a VFD chassis from a potted inductor inside the cabinet housing. In addition, a pair of parallel, vertical plates may separate the VFD chassis from an air intake fan. An air-cooled heat exchanger and a set of plenums creates a closed circuit of clean air within the sealed chamber of the cabinet.

Illustrative embodiments may include a distinct flow path for outside air. The pair of vertical plates may direct outside air to flow downwards and first make a 180° turn from downwards to upwards before the outside air enters the VFD chassis. The turn from downward flow to upward flow may cause sand, dirt and other particulates to separate from the ventilating air before the outside air passes through a shrouded plenum and into the VFD chassis. Once inside the VFD chassis, the outside air may continue through a passageway in the drive that routes the air through VFD cooling fins. After passing through the VFD chassis, the outside air may exit the cabinet through a curved exhaust vent that may encourage laminar flow. A booster fan at the cabinet's intake may create positive pressure between the pair of vertical plates, assisting the air to flow upwards against gravity and create the turn that may cause particulates to be removed from the outside air. The bottom of the cabinet may include a pallet that can be used to easily lift the cabinet with a forklift or pallet jack for easy positioning.

Figure 2A:
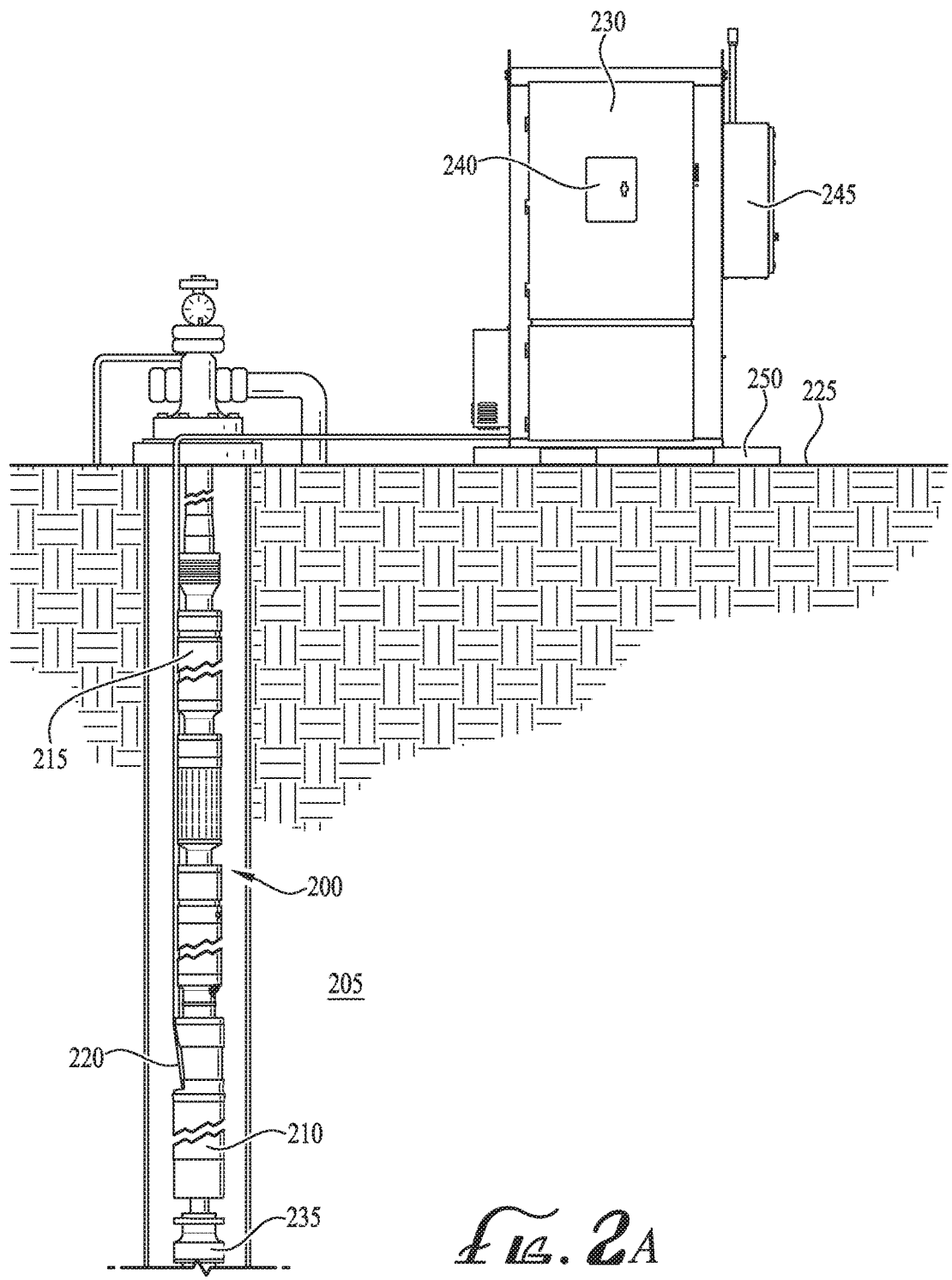
FIG. 2A is a perspective view of a VFD cabinet of an illustrative embodiment in a production field controlling an electric submersible motor of a downhole electric submersible pump.

FIG. 2A illustrates an electric submersible pump (ESP) assembly including a VFD cabinet of an illustrative embodiment. As shown in FIG. 2A, ESP assembly 200 is located downhole in production well 205. ESP assembly 200 may be vertical as shown in FIG. 2A, or maybe horizontally arranged, such as for example in a steam-assisted gravity drainage (SAGD) application. Production well 205 may include oil, heavy crude oil, bitumen, natural gas and/or water, for example, and may be located in an outdoor and/or remote location. ESP motor 210 may be an electric motor that operates to turn multi-stage centrifugal pump 215. ESP motor 210 be a two-pole, three-phase squirrel cage induction motor. Power cable 220 may connect ESP motor 210 to VFD system 700 (shown in FIG. 7) inside cabinet 230 at well surface 225.

Figure 2B:
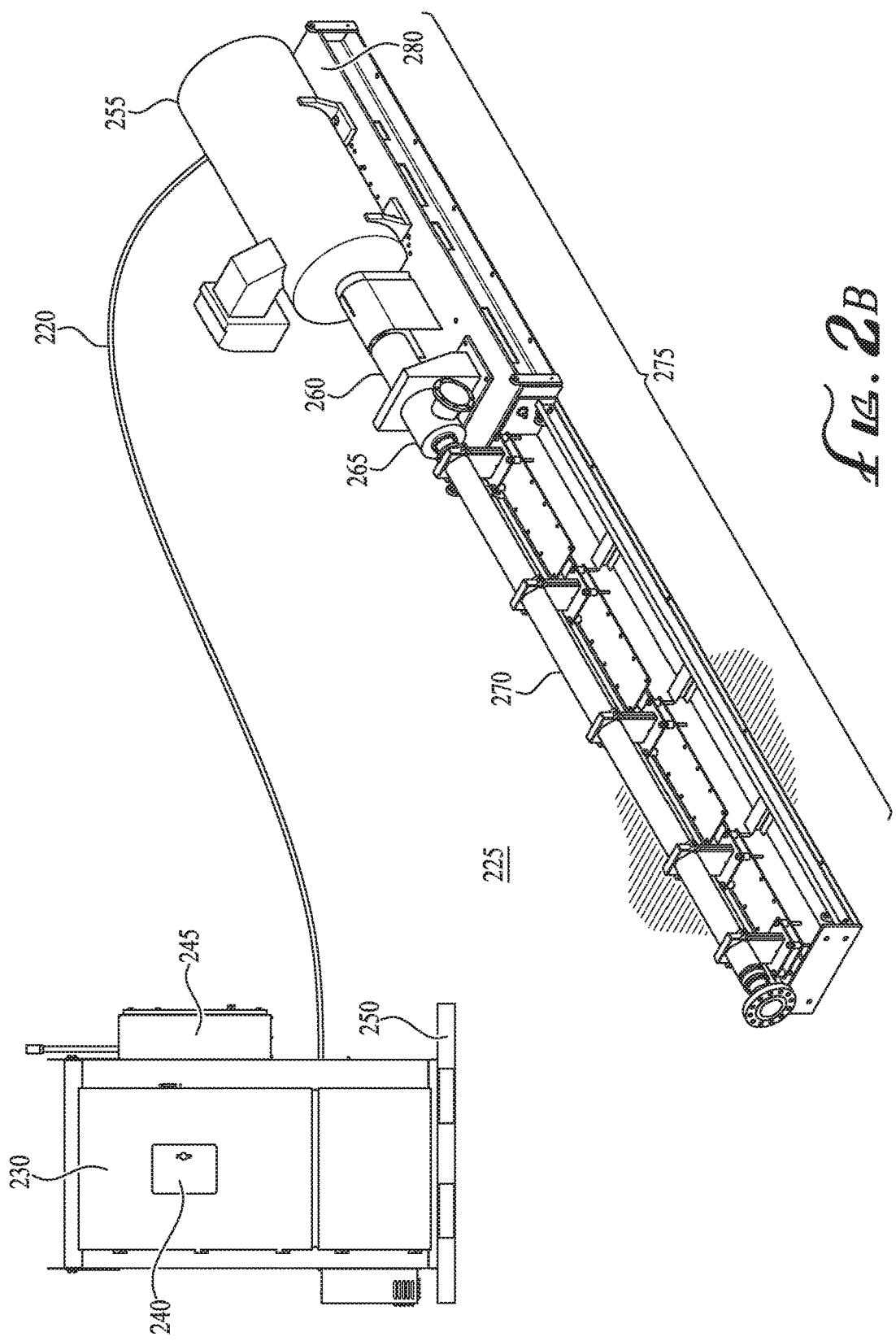
FIG. 2B is a perspective view of a VFD cabinet of an illustrative embodiment controlling a horizontal surface motor.

FIG. 2B illustrates a horizontal surface pump assembly including a VFD cabinet of an illustrative embodiment. Horizontal surface pump assembly 275 may be mounted on skid 280 and include surface motor 255 that may operate to turn horizontal centrifugal pump 270. Thrust chamber 260 and/or intake 265 may be between surface motor 255 and horizontal centrifugal pump 270. Power cable 220 may connect horizontal motor 255 to VFD system 700 within cabinet 230.

A VFD system may reside inside cabinet 230 on well surface 225 and/or proximate horizontal surface pump assembly 275 in an outdoor, hot and/or sandy location. FIG. 7 illustrates an exemplary VFD system 700 inside cabinet 230 of an illustrative embodiment. VFD system 700 may include one or more drives 605 (shown in FIG. 6) that reside inside chassis 450, VFD controller 705, user interface 610 (shown in FIG. 4) as well as other electrical connections, PLCs and/or computers that together allow VFD system 700 to control ESP motor 210 and/or surface motor 255, interact with an operator and/or store information from downhole sensors 235. Returning to FIGS. 2A-2B, power cable 220 may provide power to ESP motor 210 and/or horizontal motor 255 and electrically couple ESP motor 210 and/or horizontal motor 255 to VFD system 700, allowing an operator and/or VFD controller 705 to adjust the speed of ESP motor 210 and/or horizontal motor 255. Cabinet 230 may be metal and/or plastic and surround VFD system 700 on all sides, shielding the electrical components inside cabinet 230 from dirt and weather. Access window 240 in cabinet 230 may provide operator access to VFD system's user interface 610. Junction box 245 may be included on cabinet 230 and may house a portion of the electrical connections for VFD system 700. Base of cabinet 230 may include pallet 250. Pallet 250 may support cabinet 230 and may include openings such that cabinet 230 may be lifted and/or moved by a forklift or pallet jack.

Figure 4:
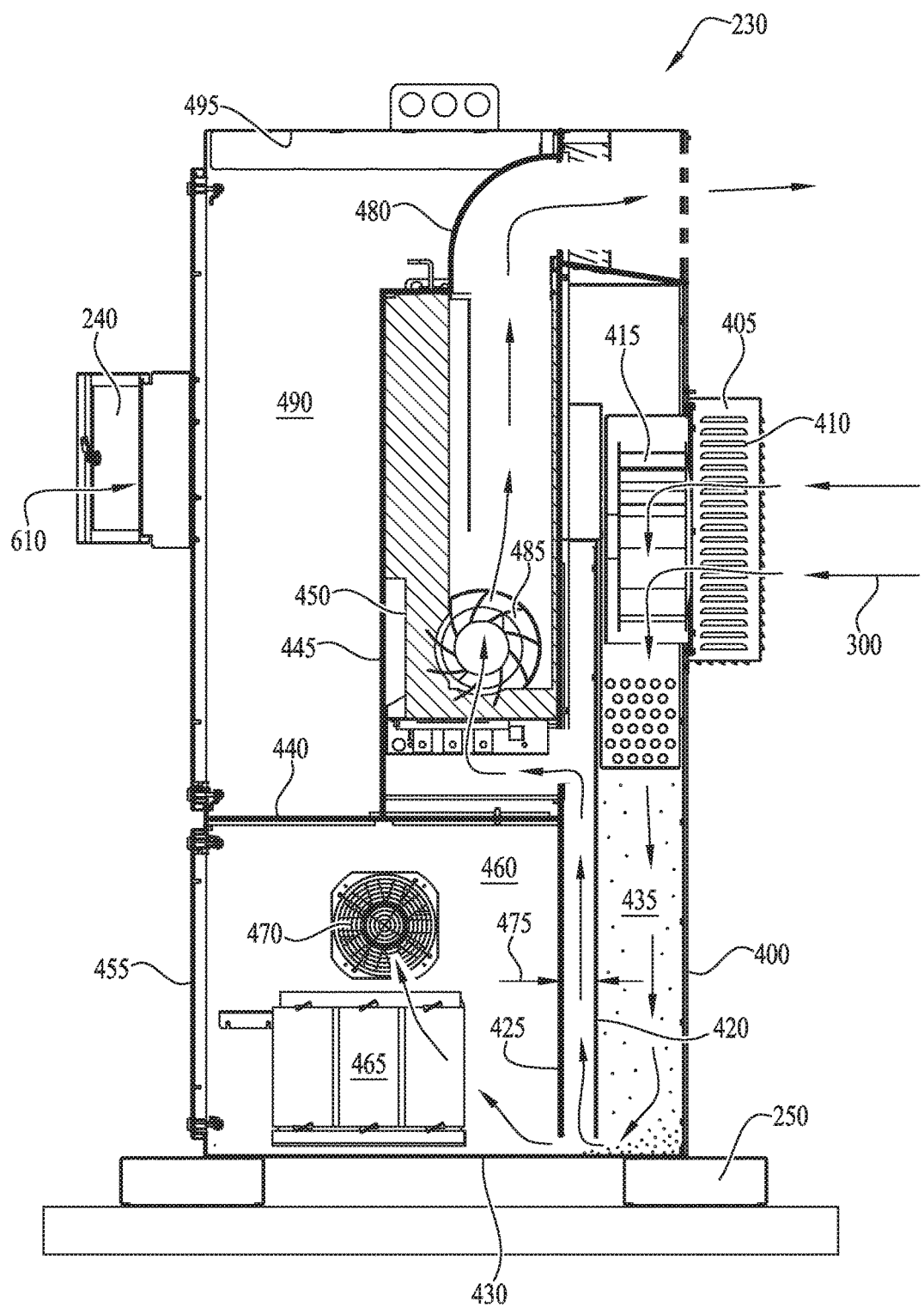
FIG. 4 is a cross sectional view across line 4-4 of FIG. 3 of an inside of a VFD cabinet of an illustrative embodiment.

FIG. 4 illustrates the inside of VFD cabinet 230 of an illustrative embodiment. As shown in FIG. 4, plates may partition the inside of cabinet 230 and provide pathways for guided airflow. Cabinet 230 may generally be rectangular in shape, with cabinet 230 enclosed on all sides. Housing 455 may surround cabinet 230 on four sides and include wall 400. Ceiling 495 and floor 430 may enclose the top and bottom of cabinet 230. Wall 400, may include intake vent 405 having louvers 410 to allow entry of outside air into cabinet 230 and/or to the inside of housing 455. As illustrated in FIG. 4, housing wall 400 including intake vent 405 is located on the backside of housing 455 opposite access window 240. An intake pressure fan 415 may be secured behind (inward of) intake vent 405. Intake pressure fan 415 may be a booster fan that creates positive pressure between first vertical plate 420 and second vertical plate 425. First vertical plate 420 and second vertical plate 425 may extend vertically and/or parallel to wall 400. First vertical plate 420 may extend from proximate intake pressure fan 415 towards floor 430, stopping short of floor 430, such as hovering one, two or a few inches above of floor 430. First vertical plate 420 may be secured to and extend between the two sides of housing 455 perpendicular to and/or adjacent wall 400. First vertical plate 420 and wall 400 may be on opposite sides of intake pressure fan 415, creating a space that forms downward air channel 435 between first vertical plate 420 and wall 400.

Second vertical plate 425 may extend parallel to first vertical plate 420 from ceiling 495 towards floor 430, but stop a few inches short of floor 430, such as by hovering one, two or a few inches above floor 430. Second vertical plate 425 may be supported by, support and/or attach to sides of housing 455 adjacent wall 400, ceiling 495, horizontal plate 440 and/or shroud 445 surrounding VFD chassis 450. Second vertical plate 425 may include apertures to allow one or more exhaust vents 480 to extend through second vertical plate 425. Horizontal plate 440 may extend between second vertical plate 425 and the front side of housing 455 and/or the side of housing 455 opposite housing wall 400. Together housing 455, horizontal plate 440, floor 430 and second vertical plate 425 may define lower chamber 460. Lower chamber 460 may include potted inductor 465 and booster exit fan 470. Air circulated by booster exit fan 470 may exit cabinet 230 through exit booster fan vent 710 (shown in FIG. 5). In some embodiments, booster exit fan 470 may be a resistor bank booster fan. The space between first horizontal plate 420 and second horizontal plate may form upward air channel 475.

Figure 9:
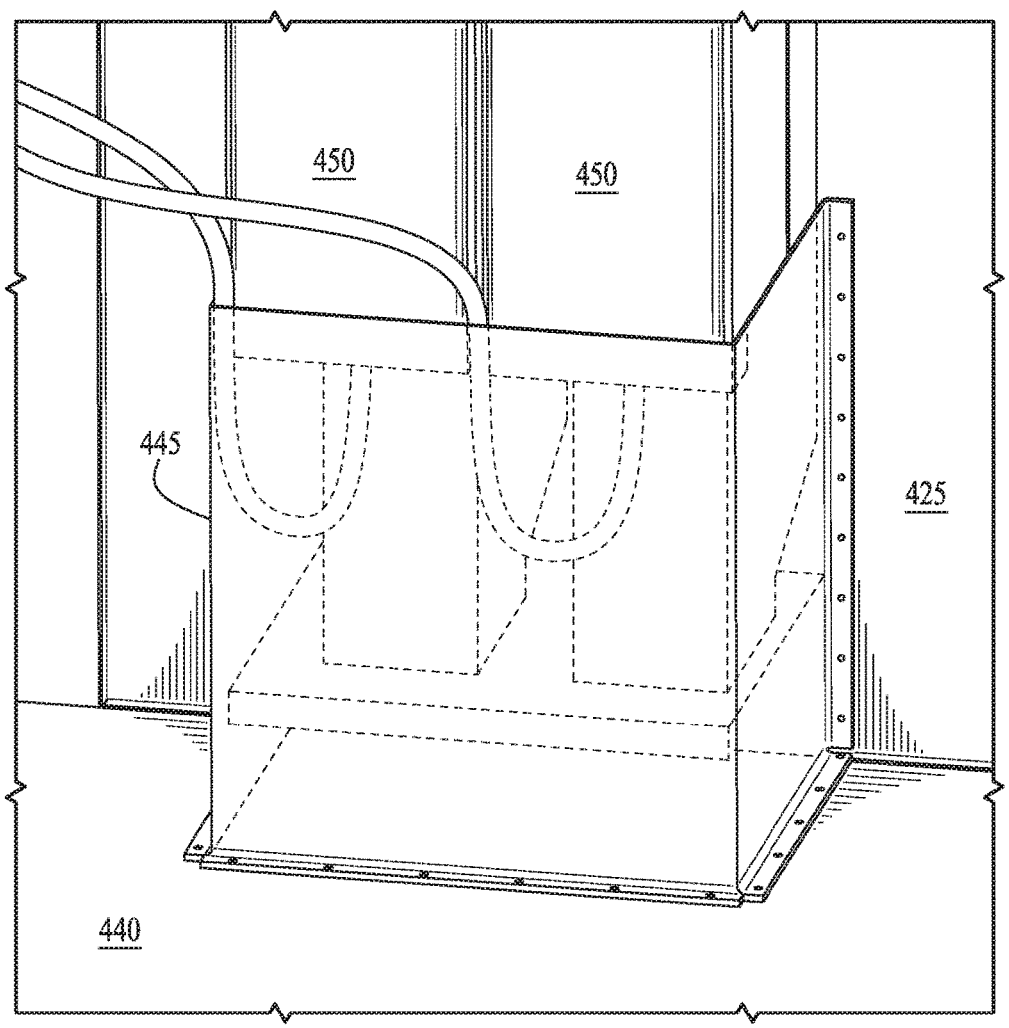
FIG. 9 is a perspective view of a shrouded VFD chassis of an illustrative embodiment While the invention is susceptible to various modifications and alternative forms, specific embodiments thereof are shown by way of example in the drawings and may herein be described in detail. The drawings may not be to scale. It should be understood, however, that the embodiments described herein and shown in the drawings are not intended to limit the invention to the particular form disclosed, but on the contrary, the intention is to cover all

Shroud 445 may be polycarbonate or another material with similar heat conduction, strength and/or toughness properties, and may be optically transparent. Shroud 445 may surround or partially surround VFD chassis 450. FIG. 9 illustrates shroud 445 of an illustrative embodiment. As shown in FIG. 9 and FIG. 4, shroud 445 may seal the space between the air exit of upward air channel 475 and the entrance to VFD chassis 450. Shroud 445 may form an intake plenum into VFD chassis 450, channeling air from upward air channel 475 into VFD chassis 450. Shroud 445 may extend upwards from horizontal plate 440 and outwards from second vertical plate 425. Shroud 445 may secure around the sides of VFD chassis 450 to connect to second vertical plate 425 that extends behind VFD chassis 450. Shroud 445 may enclose the area between horizontal plate 440 and VFD chassis 450 to form a shrouded air plenum between the air exit of upward air channel 475 and the inside of VFD chassis 450. As shown in FIG. 9, shroud 445 encloses two VFD chassis 450.

Figure 8:
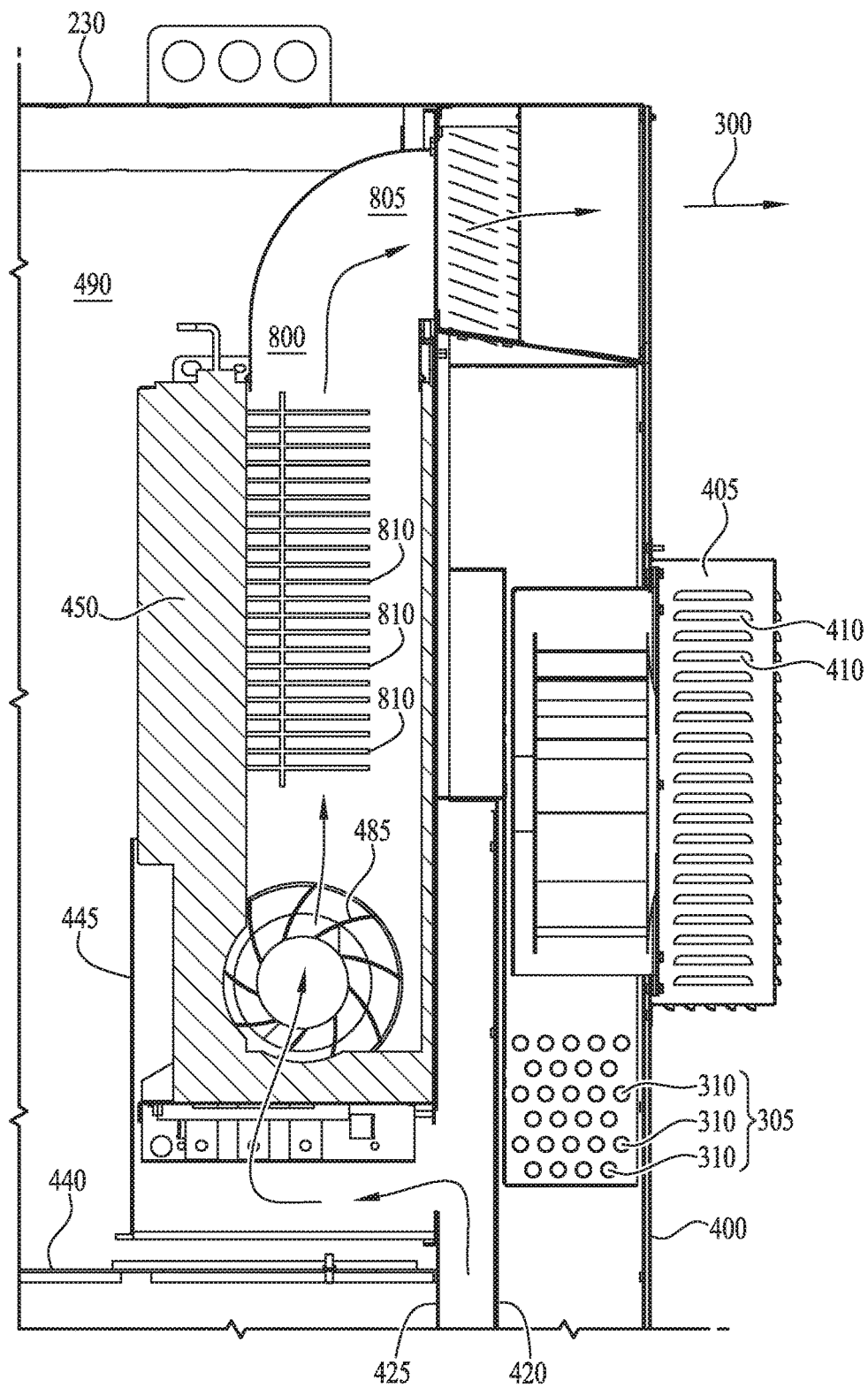
FIG. 8 is a perspective view of a VFD chassis of an illustrative embodiment.

Turning to FIG. 8, VFD chassis 450 may house drive 605 (shown in FIG. 6) of VFD system 700 and chassis fan 485. After passing through VFD chassis 450, exhaust vent 480 may guide outside air to exit cabinet 230. Exhaust vent 480 may gently curve from vertical to horizontal to encourage laminar flow of outside air 300. FIG. 8 may best illustrate the curvature of exhaust vent 480. As outside air 300 exits exhaust vent 480, exhaust vent 480 may gently guide air outside by creating a curved flow path, rather than outside air 300 bouncing off of ceiling 495. Exhaust vent 480 may curve and/or arc 90° or about 90° accepting air vertically at air entry opening 800, and expelling air horizontally at air exit opening 805 of exhaust vent 480. The sloping curvature of exhaust vent 480 may reduce turbulence and the instance of vacuum formation inside cabinet 230. Upper chamber 490 may be sealed from lower chamber 460 and defined by horizontal plate 440, second vertical plate 425 and housing 455. Upper chamber 490 may contain drive 605 electronics and other electronics included in VFD system 700 such as DIN Rails, contactors, power supplies, relays, auxiliary contacts, transformers, and PLC's.

Figure 3:
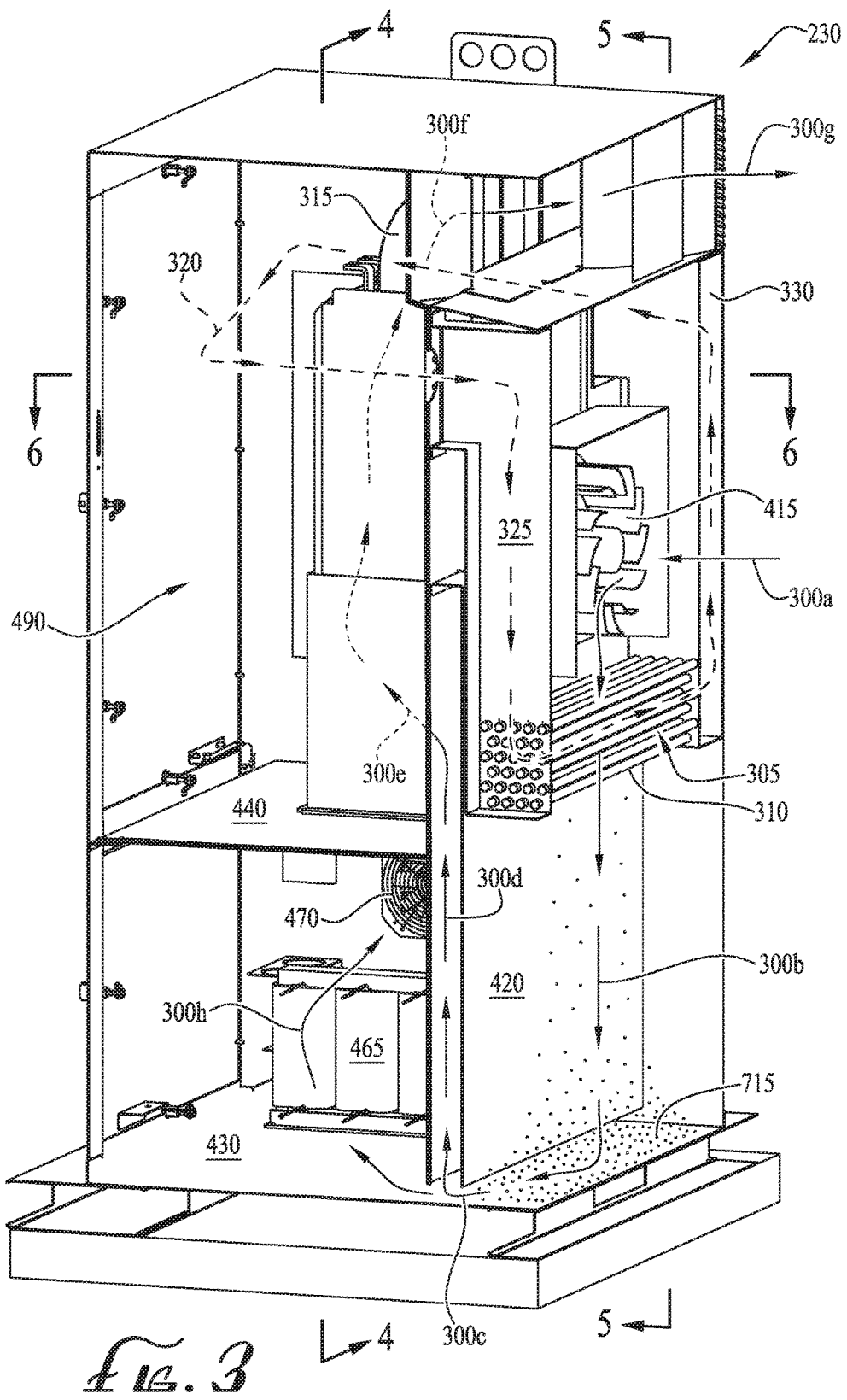
FIG. 3 is a perspective view of an inside of a VFD cabinet of an illustrative embodiment illustrating airflow through the cabinet.
Figure 5:
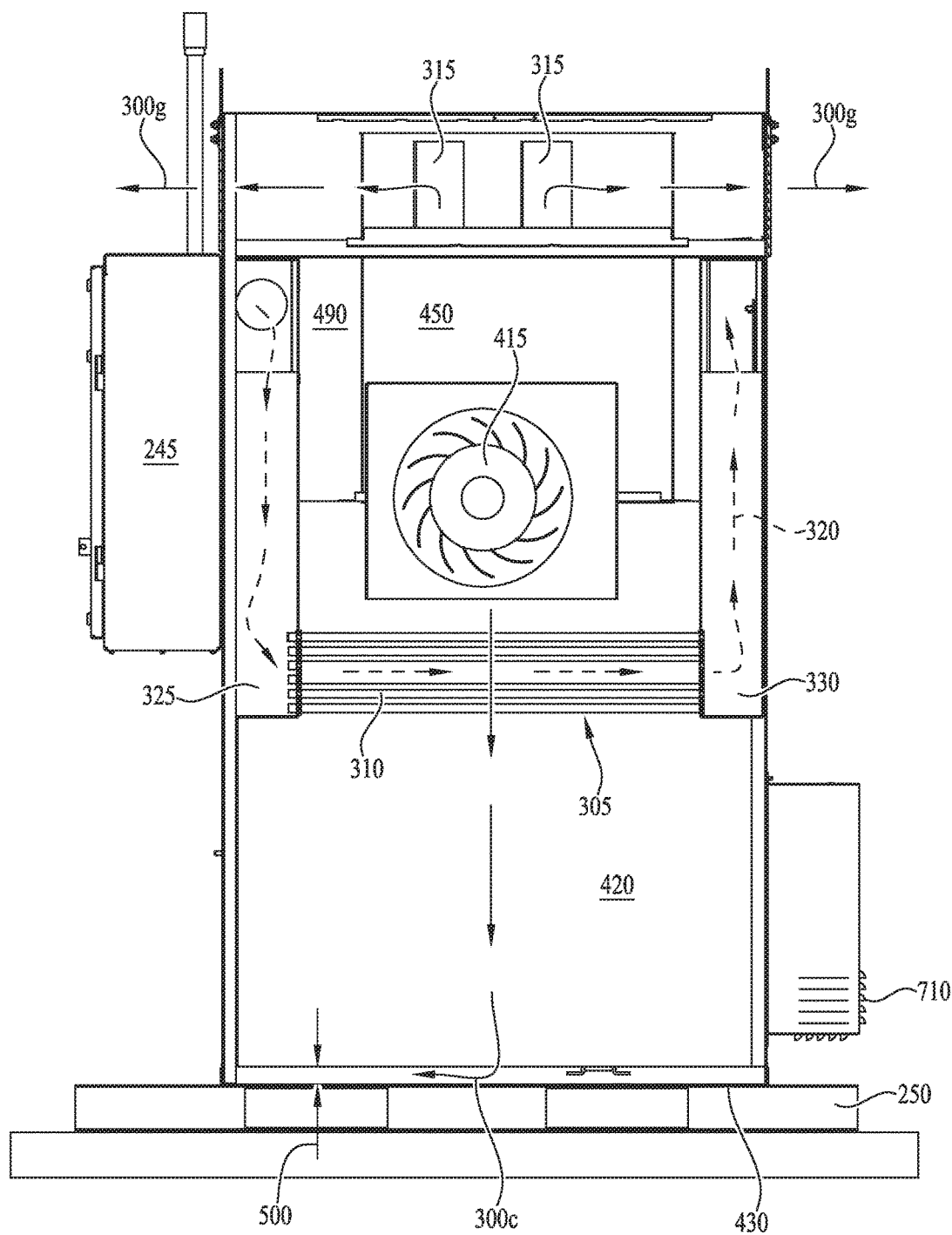
FIG. 5 is cross sectional view across line 5-5 of FIG. 3 of a VFD cabinet of an illustrative embodiment.

FIG. 3 and FIG. 5 illustrate airflow channels formed within a packaged VFD cabinet of illustrative embodiments. Two primary air channels, flow paths and/or pathways are illustrated in FIG. 3 and in FIG. 5, one channel for outside air 300, and one channel for internal air 320. Turning to FIG. 3, outside air 300 may enter cabinet 230 through intake vent 405 (shown in FIG. 4) and be pressurized by intake pressure fan 415 at outside air flow path location 300a. Outside air may then flow downwards through downward air channel 435 at outside air flow path location 300b. As outside air 300 flows downward through downward air channel 435, it may pass by the outside of air-to-air heat exchanger 305, cooling the outside of pipes 310 of heat exchanger 305. Near floor 430, outside air 300, may then travel underneath first vertical plate 420 through space 500, and turn from flowing downwards to flowing upwards at outside air flow path location 300c. Intake pressure fan 415 may create a high pressure area proximate outside air flow path location 300c and/or between first vertical plate 420 and wall 400, encouraging outside air to make the 180° turn. As outside air turns from flowing downwards to flowing upwards, dirt 715 carried by outside air 300 may separate out of outside air 300 and fall to floor 430.

Outside air 300 may then flow upwards between first vertical plate 420 and second vertical plate 425 through upward air channel 475 (shown in FIG. 4) at outside air flow path location 300d. With dirt 715 having fallen out of outside air 300, outside air 300 may then flow inside shroud 445 and inside VFD chassis 450 at outside air flow path location 300e. As illustrated in FIG. 8, a passageway in the drive may route outside air through cooling fins 810. Cooling fins 810 may be the only portion of drive 605 that contacts outside air 300. Chassis fan 485 inside chassis 450 may continue to accelerate outside air 300 upwards through curved exhaust tubes 315 of exhaust vent 480 at outside air flow path location 300f. Outside air 300 may then be returned outside VFD cabinet 230 at outside air flow path location 300g. Because there is space 500 between floor 430 and second vertical plate 425, some outside air 300 passes by potted inductor 465 in lower chamber 460 at outside air flow path location 300h. This outside air 300 may cool potted inductor 465 and/or other components inside lower chamber 460, and then exit cabinet 230 through booster exit fan 470 and booster exit fan 470 vents 710.

A distinct channel for inside air may also be formed within packaged VFD cabinet 230. Internal air 320 may remain separated from outside air 300 during normal operation of VFD system 700 (i.e., other than during setup, breakdown, or in maintenance or repair periods). As shown in FIG. 3, internal air 320 may be located inside upper chamber 490. Internal air 320 may circulate in closed circuit 600 inside cabinet 230. As shown in FIG. 3, internal air 320 may be located within upper chamber 490. From upper chamber 490, internal air 320 may flow downward through first plenum 325. First plenum 325 and second plenum 330 may extend vertically and be connected on a bottom end by heat exchanger 305. Pipes 310 of heat exchanger 305 may extend between the inside of first plenum 325 and the inside of second plenum 330. Internal air 320 may flow downward through first plenum 325, through the inside of pipes 310, and then upward through second plenum 330. From second plenum 330, internal air may return to upper chamber 490, completing closed circuit 600 through which internal air 320 may flow. In some embodiments, the direction of flow of internal air 320 may be reversed and/or first plenum 325 and second plenum 330 may be connected on a top end by heat exchanger 305. Internal air 320 may remain isolated from external air 300 throughout its closed circuit 600. Electrical components inside upper chamber 490 may thus remain clean as upper chamber 490 is not exposed to outside air 300 or any particulates such as dirt 715 that may be contained therein.

Figure 6:
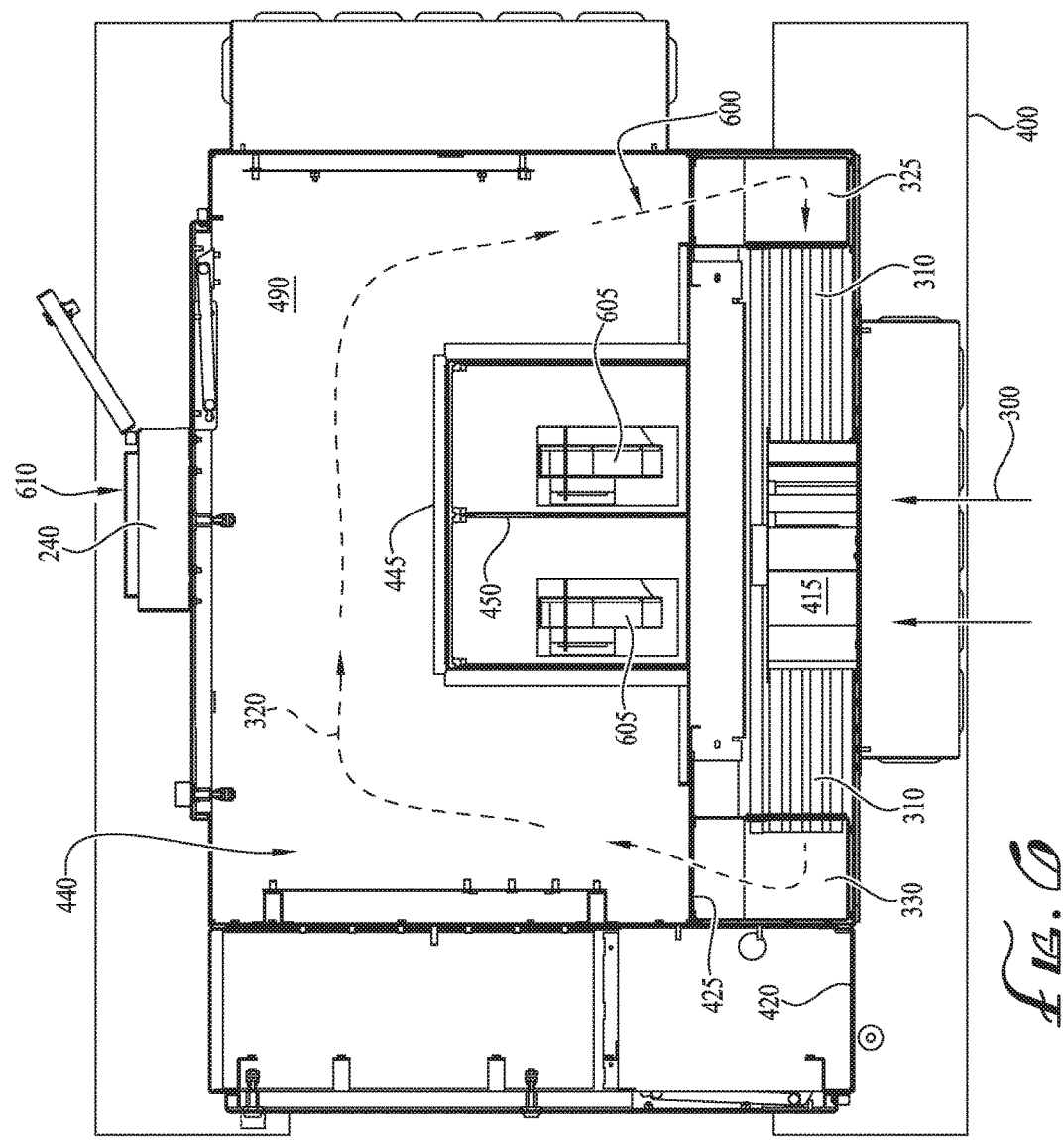
FIG. 6 is a cross sectional view across line 6-6 of FIG. 3 of a VFD cabinet of an illustrative embodiment.
Figure 7:
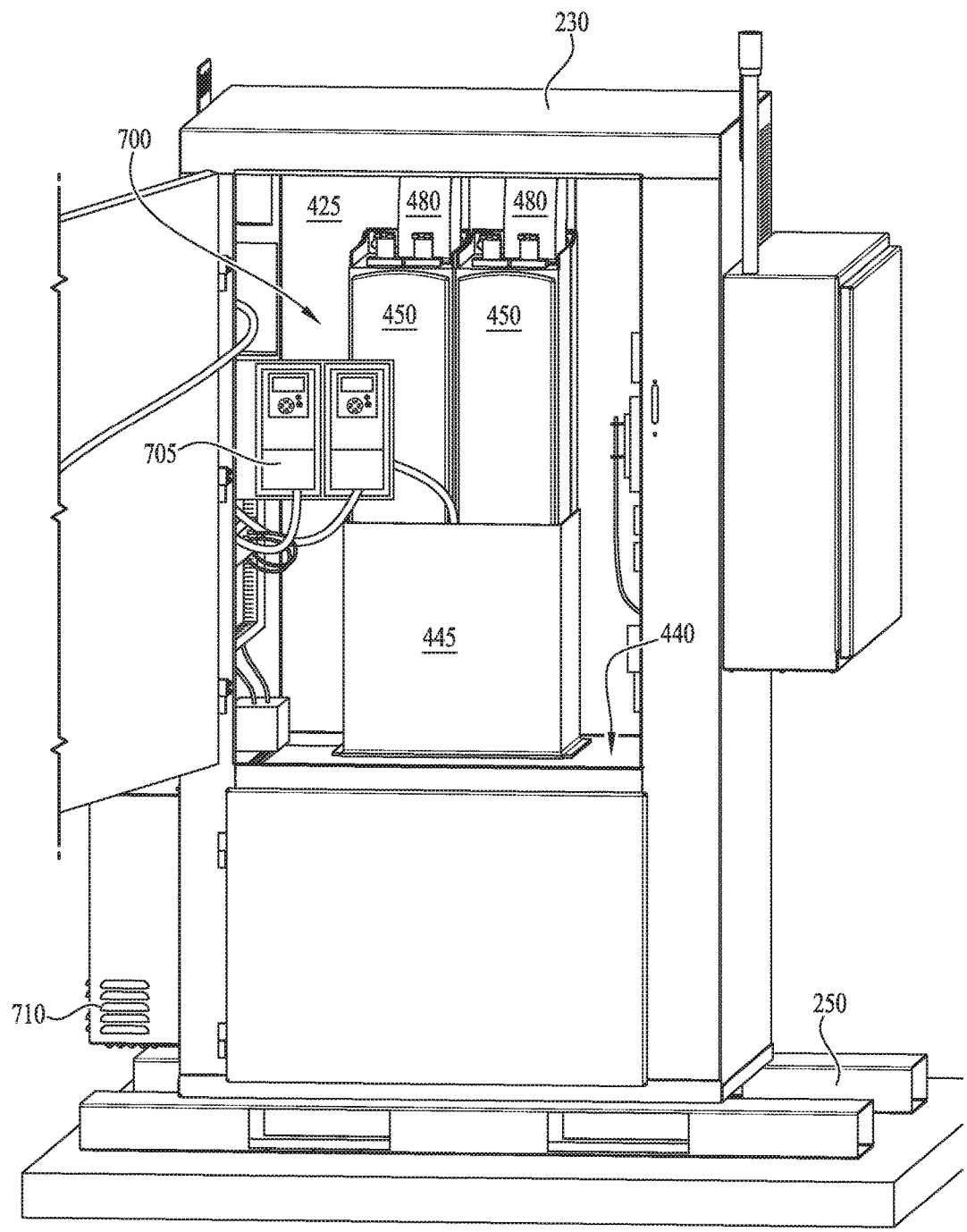
FIG. 7 is a perspective view of an inside of a VFD cabinet of an illustrative embodiment containing an exemplary VFD system.

FIG. 6 illustrates internal air closed circuit 600 of an illustrative embodiment. Internal air 320 may flow through the inside of pipes 310, whereas outside air 300 may flow around the outside of pipes 310 thereby transferring heat between internal air 320 and outside air 300. Heat may be exchanged between outside air 300 and internal air 320 through heat exchanger pipes 310, cooling internal air 320. The cooled internal air 320 may flow through upper chamber 490 and around shroud 445 and/or VFD chassis 450, cooling VFD chassis 450 from the outside and electrical components inside upper chamber 490. One or more drives 605 may reside within chassis 450. Drives 605 may benefit from cooling ventilation resulting from outside air 300 flowing through fins 810 and/or chassis 450, as well as inside air 300 flowing around the outside of shroud 445 and/or the outside of chassis 450 within upper chamber 490.

Illustrative embodiments may improve cooling within a VFD cabinet, while reducing contamination from dirt inside the cabinet. Illustrative embodiments may provide an isolated clean chamber that houses a VFD controller, VFD user interface, PLCs and other electrical components of the VFD system. Air within the clean chamber may circulate in a closed circuit in heat exchange with cooling outside air. Outside air may be directed through a labyrinth of one or more turns that causes sand, dirt and other particulates to be removed from outside air before the outside air flows through the VFD chassis that contains the drive, to cool the drive. The drive may include a passageway of fins exposed to the outside air that cool the drive. After flowing through the VFD chassis, outside air may be guided out of the cabinet through curved exhaust vents that encourage laminar flow of outside air through the cabinet.

A VFD cabinet ventilation system and apparatus has been described. Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the scope and range of equivalents as described in the following claims. In addition, it is to be understood that features described herein independently may, in certain embodiments, be combined.

What is claimed is:

1. A variable frequency drive (VFD) cabinet comprising:
portions defining an outside air flow path,
including,
an outer housing wall having an intake vent configured to provide an airflow path from outside the VFD cabinet to an air intake fan that is configured to apply positive pressure downward along a downward airflow path;
a first vertical plate inside the VFD cabinet in parallel with the outer housing wall to form the downward air flow path that receives a positive air flow pressure from the intake fan, a bottom edge of the first vertical plate above and proximate to a floor of the VFD cabinet;
a second vertical plate inside the VFD cabinet in parallel with the first vertical plate to form an upward airflow path that is fluidly coupled with the downward airflow path below the bottom edge of the first vertical plate;
a chassis inlet aperture in the second vertical plate through which the upward airflow path continues into and through a VFD chassis; and
a curved exit vent configured to redirect an upward airflow from the VFD chassis to a horizontal airflow through an outlet aperture in the outer housing wall; and
portions defining an internal air closed circuit,
including:
a chamber containing the VFD chassis and from which a downward airflow path extends into and through a first plenum,
heat exchanger pipes configured to receive the downward airflow from the first plenum, wherein at least a portion of the heat exchanger pipes are positioned in the airflow path between the outer housing wall and the first vertical plate; and
a second plenum configured to receive an upward airflow from the heat exchanger pipes and return the airflow to the chamber.

2. The VFD cabinet of claim 1, wherein the portions defining an outside air flow path comprise a shrouded plenum fluidly coupling an inside of the VFD chassis and the upward airflow path between the first vertical plate and the second vertical plate.

3. The VFD cabinet of claim 1, wherein the VFD chassis contains a chassis fan and VFD cooling fins.

4. The VFD cabinet of claim 1, wherein the curved exit vent has an inlet opening that receives outside air vertically from inside the VFD chassis.

5. The VFD cabinet of claim 1, wherein the curved exit vent curves about 90°.

6. The VFD cabinet of claim 1, wherein the air intake fan is between the outer housing wall and the first vertical plate.

7. The VFD cabinet of claim 6, wherein the air intake fan creates positive pressure proximate a portion of the cabinet defining the turn upwards between the first vertical plate and the second vertical plate.

8. The VFD cabinet of claim 1, wherein the chamber comprises a VFD controller and a VFD user interface, and the VFD chassis comprises a drive.

9. The VFD cabinet of claim 8, wherein the drive comprises a series of heat exchange fins exposed to the upward air flow path.

10. The VFD cabinet of claim 8, wherein the drive is operably coupled to an electric submersible pump motor.

11. The VFD cabinet of claim 1, comprising a lower chamber below the chamber, the lower chamber open to outside air and comprising a potted inductor and a booster fan.

12. The VFD cabinet of claim 11, wherein the booster fan is a resistor bank booster fan.

13. A variable frequency drive (VFD) cabinet comprising:
an external air open circuit including,
  a positive pressure fan configured to apply positive pressure downward to drive an airflow from a vent in an outer wall of the VFD cabinet through a downward airflow path between the outer wall and a first vertical plate toward a horizontal floor of the VFD cabinet, wherein a bottom edge of the first vertical plate is above and proximate to the horizontal floor;
  a second vertical plate parallel with the first vertical plate to form an upward airflow path that is fluidly coupled with the downward airflow path below the bottom edge of the first vertical plate;
  a chassis inlet aperture in the second vertical plate through which the upward airflow path continues into and through a VFD chassis containing a drive; and
  a curved exit vent configured to redirect an upward airflow from the VFD chassis to a horizontal airflow through an outlet aperture in the outer wall;
an internal closed circuit inside the VFD cabinet including,
  a chamber containing the VFD chassis and from which a downward airflow path extends into and through a first plenum;
  a plurality of heat exchanger pipes configured to receive the downward airflow from the first plenum, wherein at least a portion of the heat exchanger pipes are positioned in the airflow path between the outer housing wall and the first vertical plate; and
  a second plenum configured to receive an upward airflow from the heat exchanger pipes and return the airflow to the chamber.

14. The VFD cabinet of claim 13, wherein the internal air flows around an outside of the VFD chassis in the chamber.

15. The VFD cabinet of claim 13, wherein the external air open circuit extends downwards through a first channel and upwards through a second channel, wherein the first channel and the second channel are separated by the first vertical plate.

16. The VFD cabinet of claim 15, wherein air from the first channel flows underneath the first vertical plate to travel to the second channel.

* * * * *